(12) United States Patent
Botma

(10) Patent No.: US 7,400,381 B2
(45) Date of Patent: Jul. 15, 2008

(54) LITHOGRAPHIC APPARATUS AND DEVICE MANUFACTURING METHOD

(75) Inventor: Hako Botma, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 84 days.

(21) Appl. No.: 10/853,723

(22) Filed: May 26, 2004

(65) Prior Publication Data

US 2005/0264784 A1 Dec. 1, 2005

(51) Int. Cl.
*G03B 27/54* (2006.01)
*G03B 27/42* (2006.01)
*G03B 27/72* (2006.01)

(52) U.S. Cl. .............................. 355/67; 355/53; 355/71

(58) Field of Classification Search .................. 355/45, 355/59, 67, 53, 71; 359/558
See application file for complete search history.

(56) References Cited

U.S. PATENT DOCUMENTS

| | | | |
|---|---|---|---|
| 6,259,513 B1* | 7/2001 | Gallatin et al. ................ 355/71 |
| 7,030,965 B2* | 4/2006 | Takahashi .................... 355/67 |
| 2002/0085276 A1* | 7/2002 | Tanitsu et al. ............... 359/432 |
| 2002/0111606 A1* | 8/2002 | Lemberg ........................ 606/5 |
| 2003/0038931 A1* | 2/2003 | Toyoda et al. ................ 355/67 |
| 2003/0227609 A1* | 12/2003 | Oskotsky et al. ............. 355/67 |
| 2004/0130806 A1* | 7/2004 | Takahashi ................... 359/727 |

FOREIGN PATENT DOCUMENTS

EP 1 372 034 A2 12/2003
WO WO 02/35273 A1 * 5/2002

* cited by examiner

*Primary Examiner*—Alan A Mathews
(74) *Attorney, Agent, or Firm*—Pillsbury Winthrop Shaw Pittman, LLP

(57) ABSTRACT

A lithographic apparatus comprises an illumination system for providing a projection beam of radiation. A support structure is provided for supporting a patterning device, the patterning device serving to impart the projection beam with a pattern in its cross-section. A substrate table holds a substrate, while a projection system projects the patterned beam onto a target portion of the substrate. The illumination system comprises a field defining element arranged to define an illuminating field in the plane of the patterning device or in a plane conjugate thereto, the field being off-axis with respect to the optical axis of the illuminating system.

20 Claims, 5 Drawing Sheets

LITHOGRAPHIC APPARATUS AND DEVICE MANUFACTURING METHOD

FIELD OF THE INVENTION

The present invention relates to a lithographic apparatus and a device manufacturing method.

BACKGROUND TO THE INVENTION

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has been coated with a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

FIG. 1 schematically depicts an example lithographic apparatus. The apparatus comprises:
- an illumination system (illuminator) IL for providing a projection beam PB of radiation (e.g. UV radiation).
- a first support structure (e.g. a mask table) MT for supporting patterning device (e.g. a mask) MA and connected to first positioner PM for accurately positioning the patterning device with respect to item PL;
- a substrate table (e.g. a wafer table) WT for holding a substrate (e.g. a resist-coated wafer) W and connected to second positioner PW for accurately positioning the substrate with respect to item PL; and
- a projection system (e.g. a refractive projection lens) PL for imaging a pattern imparted to the projection beam PB by a patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired intensity distribution and a desired angular distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:
1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

EP1372034 describes a microlithography system which is able to generate fields of variable size for illuminating a reticle. This is desirable in order to accommodate different applications and different semiconductor die dimensions. More specifically, EP1372034 describes a system in which a collimated light beam generated by a laser is received by a first diffractive optical element. The purpose of this element is to generate an appropriate range of light angles. A zoom lens (and axicon) is placed behind the first diffractive optical element and can be adjusted so as to change the light angle range appropriate to the particular reticle and application. A second diffractive element placed behind the zoom lens acts to define the "field" which illuminates the reticle (or a conjugate plane) and to smooth variations across that field. Further optics including reticle masking blades and a ReMa lens direct the light onto the surface of the reticle. In one arrangement, the second diffractive element is changeable in order to allow the size of the reticle illuminating field to be varied. The system of EP1372034 is illustrated in FIG. 2. It is noted that in a number of alternative system architectures, the smoothing function of the second diffractive element is performed by a so called "Integrator-rod". This Integrator rod is a long rectangular transparent rod in which the light is transported by total internal reflections. However a limitation of the Integrator rod is that it can only transport mirror-symmetric pupils (due to the total internal reflections), making the arrangement of EP1372034 a useful alternative in certain circumstances.

SUMMARY OF THE INVENTION

The cost of manufacturing reticles is high and represents a significant investment for device manufacturers relative to the overall device manufacturing costs. There is therefore a move towards providing multiple mask patterns on a single reticle. The mask patterns may be used to expose areas of the same or different devices. It is of course important that only the desired pattern on such a reticle is illuminated during any given exposure step. This could be achieved using the ReMa masking blades to define an illuminating field of appropriate size. However, this would result in a loss of light energy which is undesirable.

It is an object of the present invention to provide a reticle illuminating field, the location of which can be varied without significant loss of illuminating energy.

According to a first aspect of the present invention there is provided a lithographic apparatus comprising:

an illumination system for providing a projection beam of radiation;
a support structure for supporting a patterning device, the patterning device serving to impart the projection beam with a pattern in its cross-section;
a substrate table for holding a substrate; and
a projection system for projecting the patterned beam onto a target portion of the substrate, characterized in that
the illumination system comprises a field defining element arranged to define an illuminating field in the plane of the patterning device or in a plane conjugate thereto, the field being off-axis with respect to the optical axis of the illuminating system.

Embodiments of the present invention provide in use a patterning device or reticle illuminating field which is off-axis with respect to the optical axis of the system. By careful design of said field defining element, the field can be located at a given position with respect to a patterning device, thereby illuminating only a desired portion of the patterning device.

In one embodiment, said field defining element is one of a set of field defining elements coupled to an exchange mechanism for placing a selected one of the field defining elements into the illuminating system.

In certain embodiments, the or each field defining element comprises a two-dimensional array of lenslets. In a particular embodiment, the lenslets are rectangular lenslets. Alternatively, the field defining elements may be holographic elements.

In certain embodiments, the illumination system comprises a diffractive optical element for receiving illuminating radiation from an illumination source, and a zoom lens, followed by said field defining element. In particular implementations, the illuminating system further comprises in order along the optical axis after the field defining element, a condenser lens and a relay lens.

According to a second aspect of the present invention there is provided a lithographic apparatus comprising:

an illumination system for providing a projection beam of radiation;
a support structure for supporting a patterning device, the patterning device serving to impart the projection beam with a pattern in its cross-section;
a substrate table for holding a substrate; and
a projection system for projecting the patterned beam onto a target portion of the substrate, characterized in that
the illumination system comprises a plurality of different field defining elements, each element being arranged to define an illuminating field in the plane of the patterning device or in a plane conjugate thereto, and an exchange mechanism for placing a selected one of the field defining elements into the illumination path, at least one of the field defining elements defining a field which is off-axis with respect to the optical axis of the illuminating system when that element is placed into the illumination path.

In certain embodiments, the or each field defining element comprises a two-dimensional array of lenslets. In particular variations, the lenslets are rectangular lenslets. Alternatively, the field defining elements may be holographic elements.

In certain embodiments, the illumination system comprises a diffraction optical element for receiving illuminating radiation from an illumination source, and a zoom lens, followed a field defining element placed in the illumination path by the exchange mechanism. In particular variations, the illuminating system further comprises in order along the optical axis, behind the field defining element, a condenser lens and a relay lens.

According to a third aspect of the present invention there is provided a device manufacturing method comprising the steps of:

providing a substrate;
providing a projection beam of radiation using an illumination system;
using a patterning device to impart the projection beam with a pattern in its cross-section; and
projecting the patterned beam of radiation onto a target portion of the substrate,
characterized by
using a field defining element to define an illuminating field at the patterning device which is off-axis with respect to the optical axis of the illuminating system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die"

herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 µm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

DETAILED DESCRIPTION OF CERTAIN EMBODIMENTS

Figure 1:
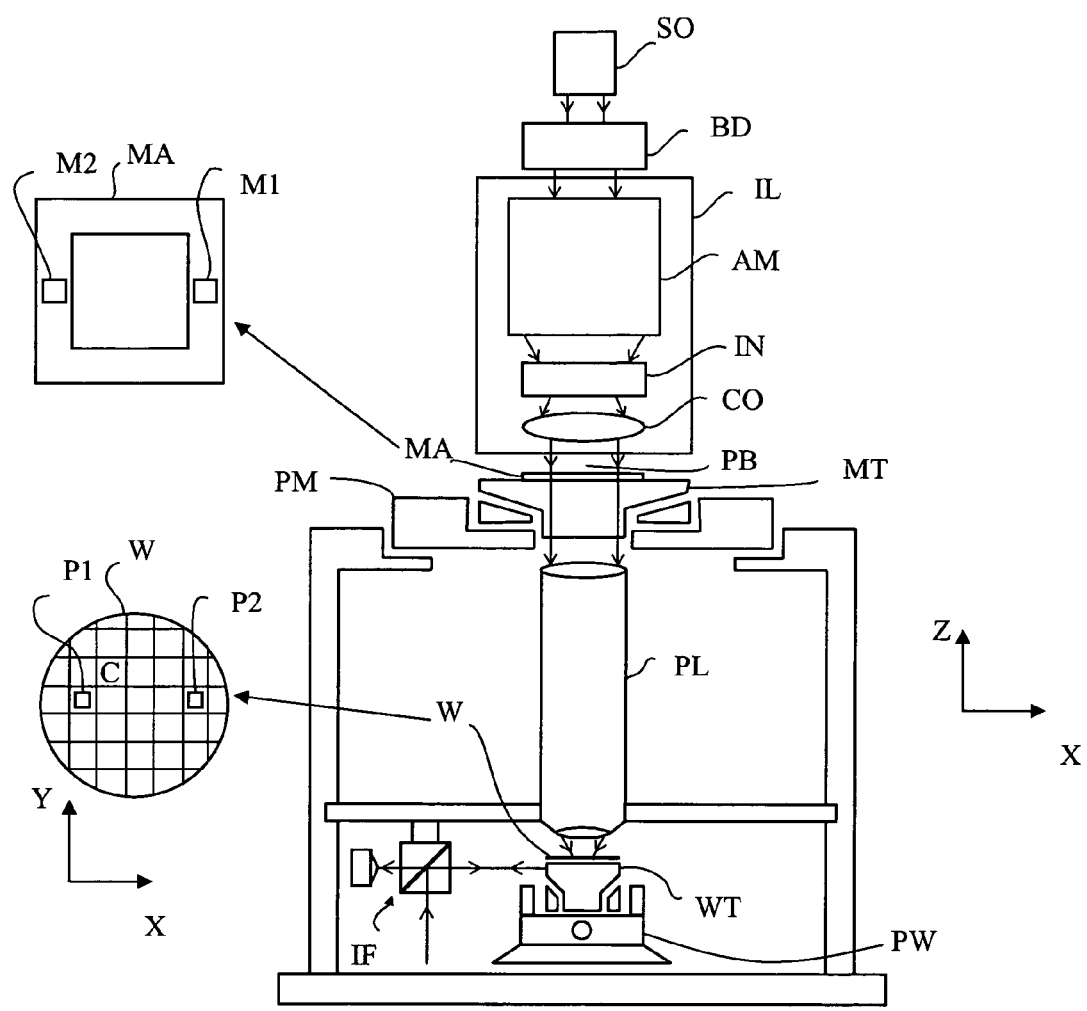
FIG. 1 illustrates schematically a known lithographic apparatus.
Figure 2:
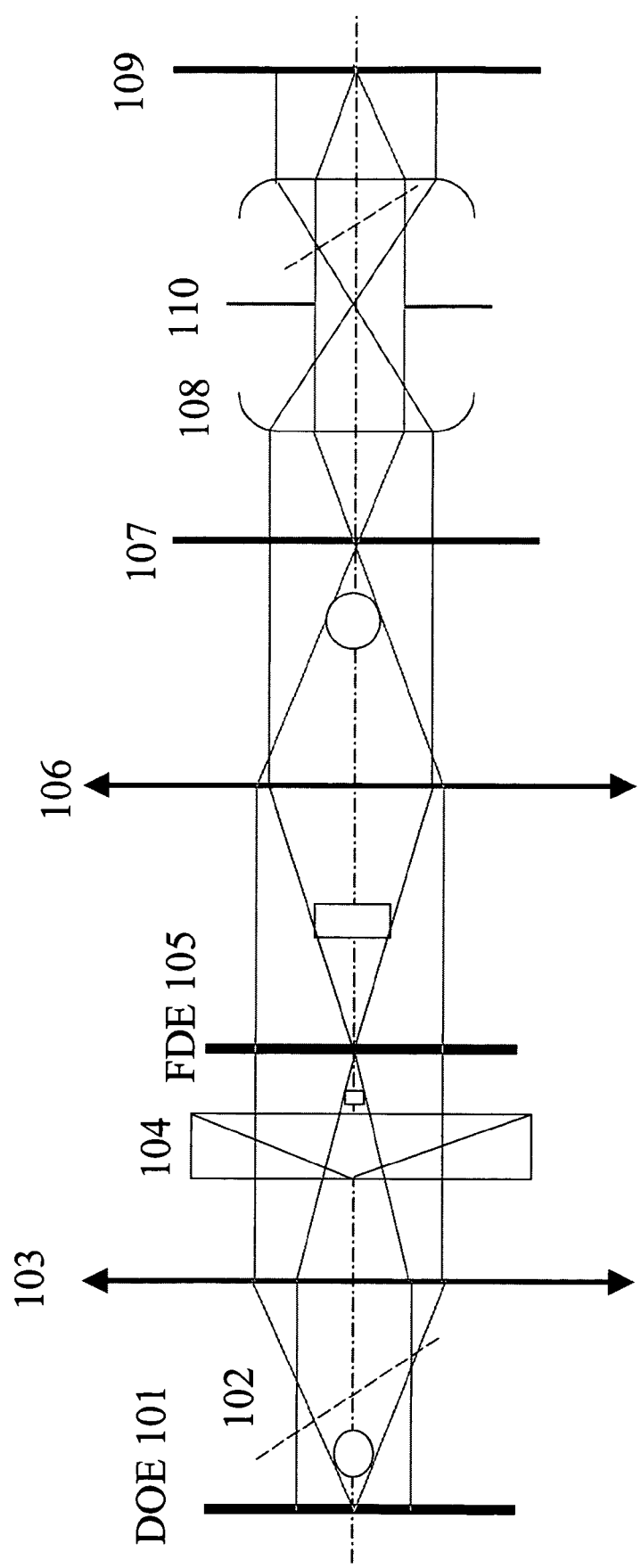
FIG. 2 illustrates schematically certain optical components of a known illumination system of the apparatus of FIG. 1.

Reference has been made above to FIG. 1 in order to illustrate a known lithographic apparatus. FIG. 2 has also been briefly discussed and illustrates certain principal components of the illuminating system IL as well as showing the mask or reticle. The illuminating system includes a first diffractive optical element 101 (DOE) which is illuminated by an illumination source (e.g. an excimer laser). The illumination is typically a coherent beam of UV radiation. The first diffractive optical element might comprise a 2-D array of spherical micro lenses, a Fresnel lens, or a diffraction grating. After passing through the first diffractive optical element, the beam reflects off a folding mirror 102 and illuminates a zoom lens 103. The fold mirror 102 is used to manage and reduce the overall size of the apparatus by folding the optical path.

The beam illuminates an axicon 104. The purpose of the axicon is to maximize the angles of the light, given that the best imaging resolutions are obtained with the steepest angles. After passing through the axicon 104, the beam passes through a second diffractive optical element 105 (FDE). This component is described in more detail below. The beam then passes though a spherical condenser lens 106 before encountering a delimiter 107. A stop 110 is placed in the centre of the relay lens 108 in order to provide a telecentric illumination system.

Figure 3:
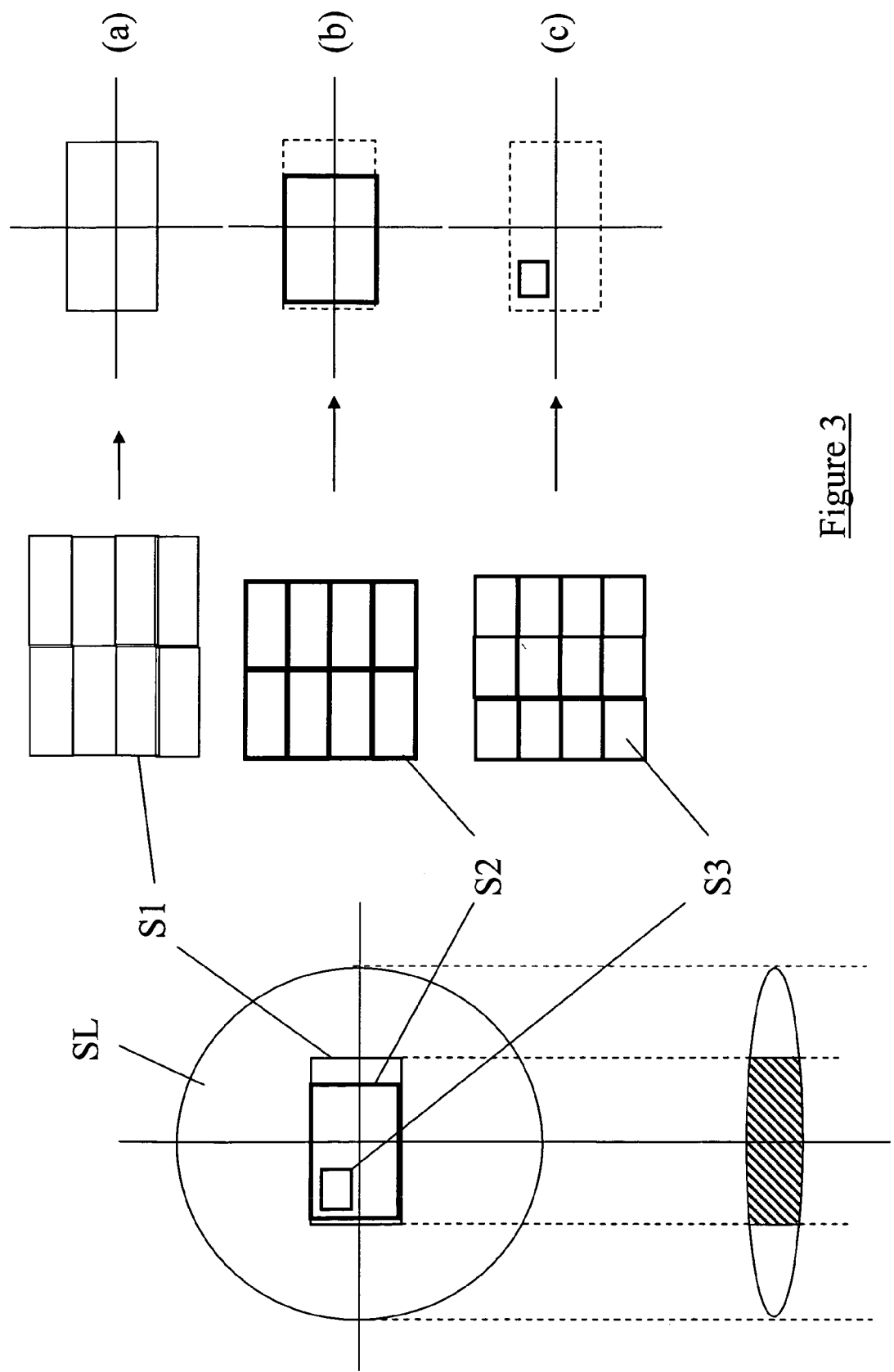
FIG. 3 illustrates the construction of a set of field defining elements.

The second diffractive optical element 105 (FDE) operates as a field defining element. That is to say that this element defines the size and shape (as well as edge contrast) of the field which is formed at the plane of the reticle 109 or at a plane which is conjugate therewith. By careful design of FDE, the position of the field can be shifted in the x and/or y directions so as to illuminate only certain parts of the reticle. FDE can be constructed in a number of ways, but perhaps the most illustrative method (although not the most practical) is to form the element by cutting rectangular sections from a spherical lens. FIG. 3 illustrates such a spherical lens (SL).

Figure 4:
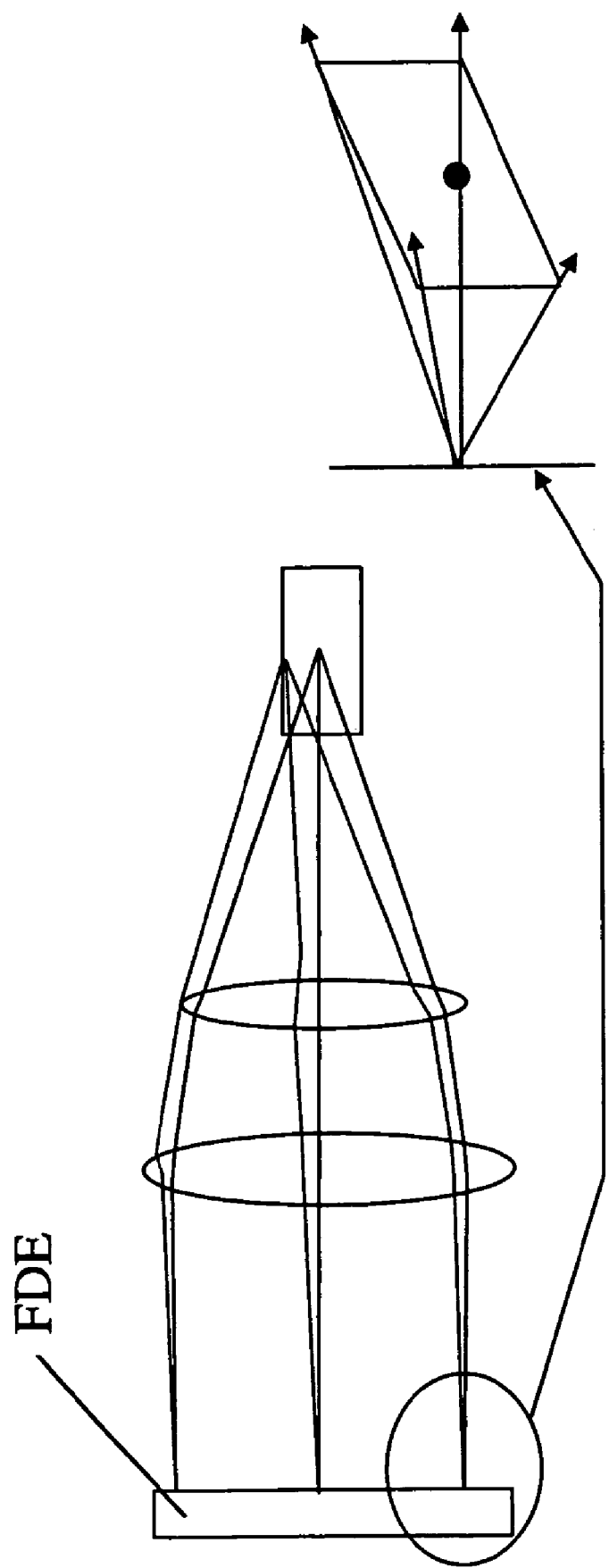
FIG. 4 illustrates the operation of one of the field defining elements of FIG. 3.

Consider the section S1 which is centered on the optical axis of the lens SL. An FDE can be constructed by cutting a set of identical sections S1 and stacking these rectangular lenslets into a 2-D array as illustrated in FIG. 3(a). As illustrated in FIG. 4, each point of the field defining element radiates a rectangular field, the fields of the points coinciding. FIG. 3(a) also illustrates the illumination field which would result from such a field defining element formed using the sections S1, from which it can be seen that the field is centered on the optical axis (both x and y) of the illuminating system. The size and shape of the field can be varied by varying the size and shape of the individual lenslets.

FIGS. 3(b) and 3(c) illustrate alternative field defining elements constructed by stacking cut sections S2 and S3 respectively. These sections are not symmetrical about the optical axis of the spherical lens S1, and therefore result in fields which are off-axis with respect to the optical axis of the illuminating system (S2 produces an off-axis field in the x direction, while S3 produces an off-axis field in both the x and y directions).

A more practical approach to the manufacture of a field defining element is to form, typically using an etch process, x-cylinder lenses on a front surface and y-cylinder lenses on the back surface. Other practical approaches involve the use of rectangular Fresnel lenses, and the use of holographic devices.

Figure 5:
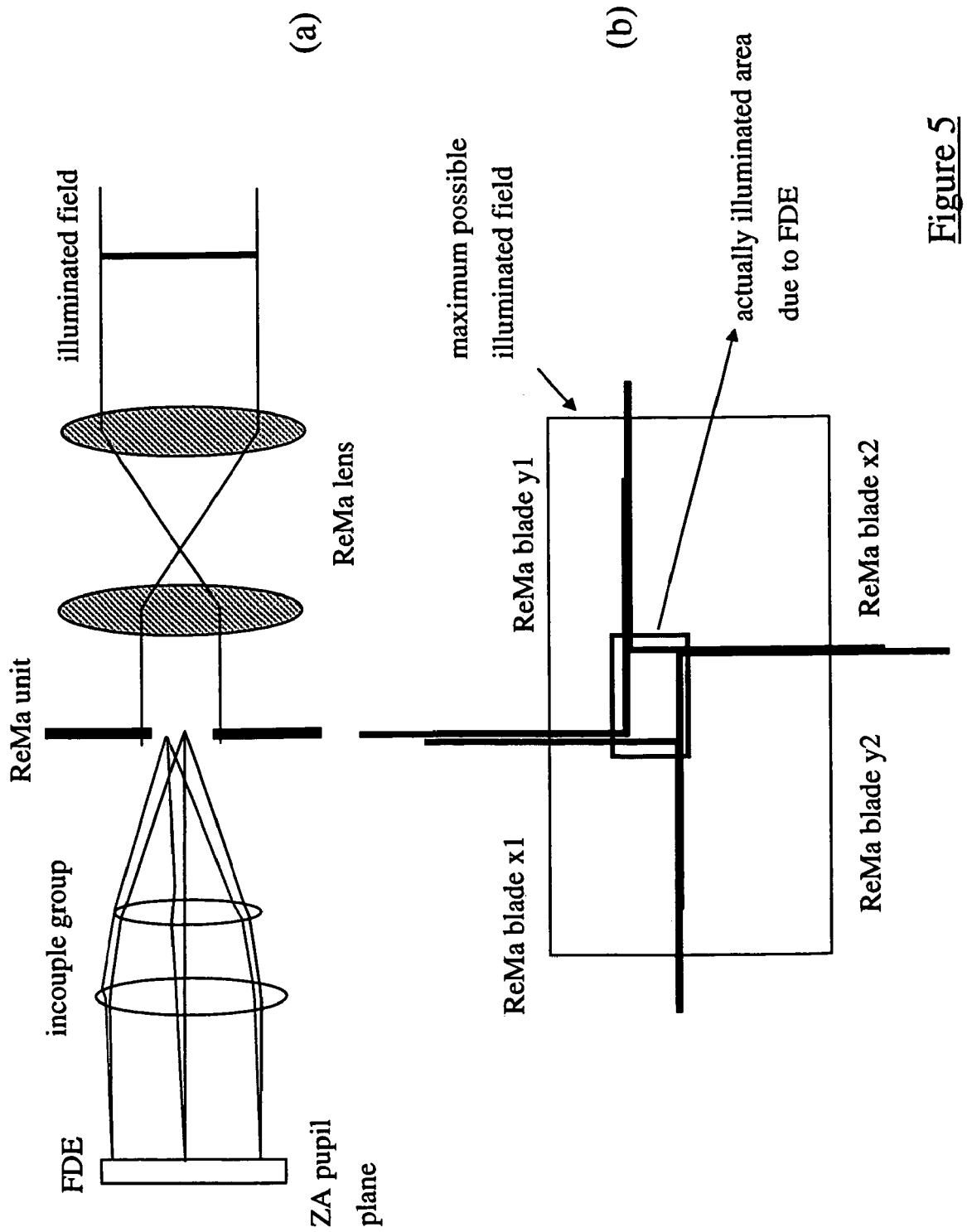
FIG. 5 illustrates further an illumination system incorporating the components illustrated in FIG. 4.

FIG. 5a further illustrates the illuminating system. The field defining element is located in the ZA pupil plane, with an incouple group (or "condenser lens") generating the field with an angular distribution as given by the shape of the pupil and with a field shape/size/position as given by the angular distribution in the pupil plane (thus generated by the FDE). Also shown are a set of ReMa blades which are used to further define the field. However, if the field defined by the field defining element is precisely as required to illuminate the chosen portion of the reticle, the ReMa blades may be dispensed with. A set of ReMa lenses follow the ReMa blades and are used to magnify the field to the desired size (typically by a factor of x1 to x4). Furthermore the ReMa lens provides a sharp image of the ReMa blades so that a sharply defined area of the reticle can be illuminated. FIG. 5b illustrates the field with and without the ReMa blades, from which it can be seen that very little light loss occurs due to the obstruction by the ReMa blades.

In the lithographic apparatus described here, the illuminated field can be located off-axis in the x and y directions. However the off-axis field remains as a whole within the maximum field sizes for x and y direction as defined by the illuminator design which again is matched to the projection lens design. This maximum field size allows illumination of the full reticle in the x and y directions (in the case of a stepper-type apparatus) or illumination of the full reticle size in the 'non-scanning' or x direction only (in case of a scanner-type apparatus). In steppers, the illuminated field can be placed off-axis in the x and/or y direction such that only the desired sub-portion of the reticle is illuminated. In the ideal case this would mean that every image on the reticle would have a corresponding FDE which would concentrate all available light on that part of the reticle only. In scanners the 'scanning' or y direction can be varied by moving the stages. Thus it is not needed to have FDE's which are off-axis in the y direction: the FDE's can be on-axis in the y direction and off-axis in the 'non-scanning' or x direction.

A practical way to reduce the number of different FDE's while substantially keeping the advantage of the improved efficiency is to divide the reticle into an integer number of rectangular area's each of which corresponding to a different FDE. For example, by splitting the reticle area 50-50 on a left and right area, a 100% intensity gain can be realized if the image on the reticle fits into either of the FDE generated fields. Even larger gains can be reached when using small images on the reticle in combination with an FDE which illuminates only that relevant part. The gain then can reach 100/A with A being the percentage of the image area to the reticle area.

While specific embodiments of the invention have been described above, it will be appreciated that the invention may be practiced otherwise than as described. The description is not intended to limit the invention.

The invention claimed is:

1. A lithographic apparatus comprising:
   an illumination system configured to condition a beam of radiation;
   a support structure to support a patterning device, the patterning device configured to impart the beam with a pattern in its cross-section;
   a substrate table configured to hold a substrate;
   a projection system configured to project the patterned beam onto a target portion of the substrate; and
   a field defining element, arranged as a part of the illumination system, configured to define an illuminating field in the plane of the patterning device or in a plane conjugate thereto that is centered off-axis with respect to the optical axis of the illumination system, the defined illuminating field defining a maximum area through which substantially all of the beam of radiation passes and the field defining element configured to pass substantially all radiation received by the field defining element toward the illuminating field.

2. Apparatus according to claim 1, wherein said field defining element is one of a set of field defining elements, the apparatus further comprising an exchange mechanism configured to place a selected one of the field defining elements into the optical path of the illumination system.

3. Apparatus according to claim 1, the field defining element comprising a two-dimensional array of lenslets.

4. Apparatus according to claim 3, the lenslets being rectangular lenslets.

5. Apparatus according to claim 1, the field defining element being a holographic element.

6. Apparatus according to claim 1, the illumination system comprising a diffractive optical element to receive illuminating radiation from an illumination source, and a zoom lens, followed by said field defining element.

7. Apparatus according to claim 6, the illumination system further comprising in order along the optical axis after the field defining element, a condenser lens and a relay lens.

8. A lithographic apparatus comprising:
   an illumination system configured to condition a beam of radiation;
   a support structure to support a patterning device, the patterning device configured to impart the beam with a pattern in its cross-section;
   a substrate table configured to hold a substrate;
   a projection system configured to project the patterned beam onto a target portion of the substrate; and
   a plurality of field defining elements, each selectively positionable into and out of an optical path of the illumination system to define an illuminating field in the plane of the patterning device or in a plane conjugate thereto, at least one of the field defining elements defining an illuminating field that defines a maximum area through which substantially all of the beam of radiation passes and is centered off-axis with respect to the optical axis of the illumination system and said at least one of the field defining elements being configured to pass substantially all radiation received by said at least one of the field defining elements toward the illuminating field.

9. Apparatus according to claim 8, further comprising an exchanger, constructed and arranged to exchange a selected one of the field defining elements into an optical path of the illumination system.

10. Apparatus according to claim 8, said at least one of the field defining elements comprising a two-dimensional array of lenslets.

11. Apparatus according to claim 10, the lenslets being rectangular lenslets.

12. Apparatus according to claim 8, said at least one of the field defining elements being a holographic element.

13. Apparatus according to claim 8, the illumination system comprising a diffraction optical element to receive illuminating radiation from an illumination source, and a zoom lens, located at respective positions of the illumination system on an object side of a position in the optical path into which one of the plurality of field defining elements is positionable.

14. Apparatus according to claim 13, the illumination system further comprising in order along the optical axis, on an image side of a position in the optical path into which one of the plurality of field defining elements is positionable, a condenser lens and a relay lens.

15. A device manufacturing method comprising:
 patterning a beam of radiation with a pattern in its cross-section, using a patterning device;
 defining an illuminating field, using a field defining element, at the patterning device or in a plane conjugate thereto which is centered off-axis with respect to the optical axis of an illuminating system used to supply the beam of radiation to the patterning device, the illuminating field defining a maximum area through which substantially all of the beam of radiation passes and the field defining element passing substantially all radiation received by the field defining element toward the illuminating field; and
 projecting the patterned beam of radiation onto a target portion of a substrate.

16. The method according to claim 15, comprising defining the illuminating field using a two-dimensional array of lenslets.

17. The method according to claim 16, wherein the lenslets comprise rectangular lenslets.

18. The method according to claim 15, comprising defining the illuminating field using a holographic element.

19. The method according to claim 15, wherein said field defining element is one of a plurality of field defining elements each selectively positionable into and out of an optical path of the illumination system.

20. The method according to claim 15, further comprising receiving illuminating radiation from an illumination source using a diffractive optical element and receiving the illuminating radiation after the diffractive optical element with a zoom lens and wherein defining the illuminating field follows receipt by the diffractive optical element and the zoom lens of the illuminating radiation.

* * * * *